United States Patent [19]

Anantha et al.

[11] 4,316,319

[45] Feb. 23, 1982

[54] METHOD FOR MAKING A HIGH SHEET RESISTANCE STRUCTURE FOR HIGH DENSITY INTEGRATED CIRCUITS

[75] Inventors: Narasipur G. Anantha, Hopewell Junction; Auugustine W. Chang, Wappingers Falls, both of N.Y.

[73] Assignee: International Business Machines Corporation, Armonk, N.Y.

[21] Appl. No.: 141,717

[22] Filed: Apr. 18, 1980

Related U.S. Application Data

[62] Division of Ser. No. 844,768, Oct. 25, 1977, Pat. No. 4,228,450.

[51] Int. Cl.³ .................... H01L 21/22; H01L 21/265
[52] U.S. Cl. ..................... 29/577 C; 29/571; 29/576 B; 29/578; 148/1.5; 148/175; 148/187; 357/51
[58] Field of Search ............ 148/1.5, 175, 187; 29/571, 576 B, 577 C, 578; 357/34, 50, 51, 91

[56] References Cited

U.S. PATENT DOCUMENTS

| | | | |
|---|---|---|---|
| 3,368,113 | 2/1968 | Shaunfield | 148/175 X |
| 3,404,321 | 10/1968 | Kurosawa et al. | 357/51 |
| 3,430,110 | 2/1969 | Goshgarian | 357/51 |
| 3,786,318 | 1/1974 | Momoi et al. | 357/49 |
| 3,795,828 | 3/1974 | Cavaliere et al. | 357/51 X |
| 3,873,383 | 3/1975 | Kooi | 148/187 |
| 3,959,040 | 5/1976 | Robertson | 148/187 X |
| 4,053,915 | 10/1977 | Cave | 357/51 X |
| 4,111,720 | 9/1978 | Michel et al. | 357/50 X |
| 4,159,915 | 7/1979 | Anantha et al. | 148/1.5 |
| 4,161,742 | 7/1979 | Kane | 357/51 X |

OTHER PUBLICATIONS

Gates, H. R., "Semiconductor Resistor", I.B.M. Tech. Discl. Bull., vol. 8, No. 12, May 1966, pp. 1849–1850.
Baker et al., "Three-Layered Underpass Resistor Structure", IBID., vol. 14, No. 10, Mar. 1972, p. 2902.
"RCA Linear Integrated Circuits", Textbook, 1970, pp. 27–28.
Hadamard, G. J., "Integrated Circuits . . . Parasitic . . . Effects", I.B.M. Tech. Discl. Bull., vol. 14, No. 4, Sep. 1971, pp. 1075–1076.

*Primary Examiner*—R. Dean
*Assistant Examiner*—W. G. Saba
*Attorney, Agent, or Firm*—George O. Saile

[57] ABSTRACT

A high sheet resistance structure for high density integrated circuits and the method for manufacturing such structure is given. The structure includes a silicon region separated from other silicon regions by a dielectric barrier surrounding the region. A resistor of a first conductivity, for example, N type, encompasses substantially the surface of the silicon region. Electrical contacts are made to the resistor. A region highly doped of a second conductivity, for example, P-type, is located below a portion of the resistor region. This region of second conductivity is connected to the surface. Electrical contacts are made to this varied region for biasing purposes. A second region within the same isolated silicon region may be used as a resistor. This region is located below the buried region of second conductivity. Alternatively, the described resistor regions can be connected as transistors. This allows the formation of a standard masterslice which can be personalized at a late stage in the manufacturing to either resistors or transistors in all or a portion of the standard regions.

7 Claims, 10 Drawing Figures

METHOD FOR MAKING A HIGH SHEET RESISTANCE STRUCTURE FOR HIGH DENSITY INTEGRATED CIRCUITS

This is a divisional patent application of patent application Ser. No. 844,768 filed Oct. 25, 1977 which is now U.S. Pat. No. 4,228,450 issued Oct. 14, 1980.

BACKGROUND OF THE INVENTION

The invention relates to resistance structures for high density integrated circuits and to methods for forming a highly dense masterslice structure which may be advantageously utilized to form resistors or transistors in an integrated circuit structure.

CROSS REFERENCE TO RELATED APPLICATIONS

N. Anantha et. al. U.S. Pat. No. 4,159,915 issued July 3, 1979, and U.S. Pat. No. 4,214,315 issued July 22, 1980 and filed simultaneously with this application.

N. Anantha et. al. U.S. Pat. No. 4,160,991 issued July 10, 1979 and U.S. Pat. No. 4,236,294 issued Dec. 2, 1980 and filed simultaneously with this application.

DESCRIPTION OF THE PRIOR ART

In the monolithic integrated circuit technology, it is usually necessary to isolate various active and passive elements from one another in the integrated circuit structure. These devices have been isolated by back-biasing PN junctions, partial dielectric isolation and complete dielectric isolation. The dielectric materials used have been silicon dioxide, glass, and so forth. The preferred isolation for these active devices and circuits particularly as integration density has increased is some form of dielectric isolation. The dielectric isolation has substantial advantage over the PN junction isolation because it allows the abutting of the circuit elements against the isolation and thereby results in greater density of packing of the active and passive devices on the integrated circuit chip. Dielectric isolation reduces associated parasitic capacitance and hence improves circuit performance.

Dielectric isolation techniques of today usually involve the formation of grooves or channels in a silicon body and the filling thereof with a dielectric material. One technique is to form the openings by chemical etching and is described fully in E. Kooi U.S. Pat. No. 3,970,486, Clevenger U.S. Pat. No. 3,534,234, Peltzer et al U.S. Pat. No. 3,648,125 and I. Magdo et al U.S. patent application Ser. No. 150,609, filed June 7, 1971. Another technique involves selectively forming an epitaxial layer with grooves or openings therein and is described in V. Y. Doo U.S. Pat. No. 3,386,865 and "A Composite Insulator-Junction Isolation" by R. E. Jones et al, published in Electrochemical Technology, Vol. 5, No. 5-6, May-June 1967, pp 308-310. Another technique for forming grooves is shown by Hochberg U.S. Pat. No. 3,966,577, T. Kaji et al U.S. Pat. No. 3,997,378, and S. A. Abbas, IBM TDB, Vol. 20, No. 1, p. 144 June 1977, and Bondur et al U.S. patent application Ser. No. 824,361, filed Aug. 15, 1977, uses reactive ion etching.

Isolated pockets of monolithic silicon is the result of the isolation process described in the previous paragraph. Active devices, such as bipolar transistors, field effect transistors, and passive devices such as resistors, diodes, and so forth, may then be formed in these monocrystalline silicon pockets. The essential steps in the formation of silicon planar devices may be seen, for example, in the book "Modern Microelectronics" by Max Fogiel published by Research and Education Assoc., 342 Madison Ave., New York, N.Y. 10017, 1972 (See particularly pages 463-472). Briefly, the process involves obtaining, for example, a P substrate of silicon, oxidizing the surface opening a window in the silicon dioxide using standard photolithography and etching techniques, diffusing an N+ buried region through the opening. The silicon dioxide is removed and an epitaxial layer of N-type silicon is grown thereover. During the epitaxial layer growth there is some outdiffusion of the buried layer into the epitaxial layer. The buried layer is destined to become the subcollector of an NPN transistor in this example. Another silicon dioxide layer is grown on the surface of the epitaxial layer, openings for isolation diffusion in the silicon dioxide are formed by photoresist and etching techniques, and the isolation diffusion or dielectric isolation is formed to isolate pockets of monocrystalline silicon. Openings are formed in the silicon dioxide coating where the base of the NPN transistor is to be formed and any P-type resistors are to be formed, and a P-type diffusion forms PN junctions in the N epitaxy layer. The surface is reoxidized and the use of photolithography and etching techniques made to open the regions destined to be the emitter and the collector reach-through. The emitter and reach-through diffusions are made. The surface is again oxidized. Openings are made in the silicon dioxide mask using conventional photolithography and etching techniques for the ohmic contact purposes. The entire surface is metallized, such as with aluminum film, and using conventional photolithography and etching techniques, the interconnections are formed through the etching away of the metal film.

Diffused resistors are generally used in the manufacture of integrated circuits, however, they are normally formed during the base diffusion of a bipolar transistor integrated circuit structure. This is illustrated in the previous paragraph and in Schlegel U.S. Pat. No. 3,591,430, S. P. Davis U.S. Pat. No. 3,772,097, G. K. Lunn U.S. Pat. No. 3,700,977 and P. W. Robertson U.S. Pat. No. 3,959,040. This type of resistor has disadvantages when it is desired to go to greater density in the integrated circuits. Some of the disadvantages are that the diffusion depth has to be deep enough to allow another diffusion of opposite polarity, for example, the emitter. Furthermore, the base region normally requires doping around $10^{18}$ atoms/cm$^3$. High value resistors cannot be made at high doping levels of $10^{18}$ atoms/cm$^3$. This type of resistor is not suitable for low power, high density IC's. The resistors and structures described herein have high value, tight tolerance resistance sheet rhos. This is advantageous to high density IC and results in low cost per logic circuit.

Resistors have also been formed in the N epitaxy region such as is shown by R. A. Pedersen, U.S. Pat. No. 3,860,836. In this patent the resistor is isolated from other devices by P-N junction isolation. This type of device has the disadvantage when a highly integrated structure is desired of high valued N− epitaxy resistors. Autodoping from adjacent pockets (N+ or P+) will modulate the N− layer during epitaxial layer growth. The effect will be a poor tolerance sheet resistance (usually plus or minus 40%). Further, the epitaxial layer is necessarily very thick for fabricating a transistor. Hence, the sheet rho cannot be high even without the autodoping effect.

A wide variety of defused, ion implanted epitaxial grown regions of various N and P conductivities in various configurations have been formed in isolated monocrystalline silicon pockets. Examples of this are shown in the patents and publications cited above. Further citations of this type of structure is shown by M. V. Vora U.S. Pat. No. 3,703,420 and W. T. Matzen et al U.S. Pat. No. 3,982,266 which show junction isolation. R. D. Schinella et al U.S. Pat. No. 3,919,005 and I. E. Magdo et al U.S. Pat. No. 3,954,523 show dielectric isolated monocrystalline silicon pockets.

SUMMARY OF THE PRESENT INVENTION

In accordance with the present invention, a resistance structure for high density integrated circuits is described. The resistance structure includes a silicon region separated from other silicon regions by a dielectric barrier. A resistor of one conductivity encompasses substantially the surface of the silicon region. A region of the opposite conductivity is located below a portion of the silicon region and a reach-through connects the buried region to the surface. The electrical contacts are made to the resistor. Other electrical contacts are made to the buried regions which is utilized for biasing purposes to isolate the resistor region from the remaining lower portion of the silicon body. A second resistor can be made in the same silicon region as the first resistor. This second resistor is located below the buried region with reach-throughs to connect the second resistor to the surface of the silicon region where electrical contacts can be made thereto.

An integrated circuit structure is also described. This structure is composed of silicon regions separated from like silicon regions by a dielectric barrier. Each of the silicon regions include a base region of one conductivity, a second region over the base region of a second conductivity, a third region of the first conductivity buried within the second region and a reach-through region of the first conductivity connecting the surface of the silicon regions with the third region. This integrated circuit structure is useful as a masterslice which can be personalized at the time of forming electrical contacts to the regions as either a transistor or a resistor with electrical connections between these two alternate types of devices.

Methods are also described for fabricating the resistor structure for integrated circuits and the masterslice integrated circuit structure. A monocrystalline silicon body is provided which includes a substrate of the first conductivity and the region of a second conductivity thereover. A pattern of dielectric regions are formed in this monocrystalline body which isolate surface regions of the body from one another. A buried region is formed of the first conductivity within the region of the second conductivity and a reach-through region of the first conductivity is formed to connect the surface of the silicon region to the buried region. Electrical contacts are then made to the various regions within the isolated silicon regions to fabricate, as desired, resistors and/or transistors.

DESCRIPTION OF THE PREFERRED EMBODIMENTS

Figure 1:
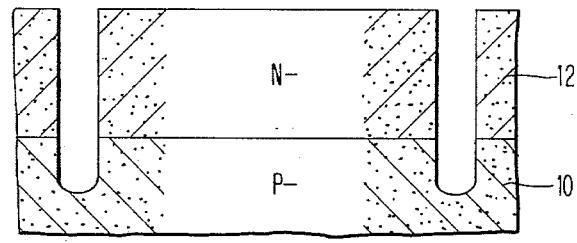
FIGS. 1-4 illustrate the method of fabricating and the final structure of one form of a resistor of the present invention.

Referring now more particularly to FIGS. 1-4, the manufacturing steps for one form of the invention involves starting with the wafer or substrate 10 of P− silicon monocrystalline material. The substrate 10 is fabricated, for example, by pulling a monocrystalline rod from a suitable melt containing a P-type material such as boron and using a seed crystal having a <100> crystallographic orientation. The resulting rod is then sliced into very thin wafers which also have the surface crystallographic orientation of <100>. The P− silicon wafer has preferably a resistivity of 10-20 ohms centimeter.

The structure is then placed in an epitaxial growth chamber wherein an epitaxial layer 12 is grown on the surface of the substrate 10. The epitaxial layer may be any desired thickness, however, for the purpose of high performance device of the type involved in the present invention, the thickness should be less than about 2 micrometers. The preferred thickness of the epitaxial layer is about 1.2 micrometers. Layer 12 is grown onto the substrate 10, by conventional techniques such as the use of $SiCl_4/H_2$ or $SiH_4/H_2$ mixtures of about 1000° to 1200° C.

The next series of steps is directed to the technique for reactive ion etching of the silicon structure. A silicon dioxide layer (not shown) is formed by conventional techniques of either thermal growth at a temperature of 970° C. in wet or dry oxygen ambient or by chemical vapor deposition. Other mask materials can also be used such as silicon nitride and aluminum oxide or combinations thereof. It is preferred that a 1000 to 3000 Å silicon dioxide coating be formed by a chemical vapor deposition of using a mixture of silane and $N_2O$ at 800° C. in a nitrogen ambient. Suitable openings are formed by conventional photolithography and etching techniques in the silicon dioxide layer where the isolation regions are to be formed. The structure is then put into a silicon reactive ion etching ambient. The process for this reactive ion etching may be more fully understood by reference to the J. N. Harvilchuck et al patent application Ser. No. 594,418, filed July 9, 1975 now abandoned, replaced with continuation patent application Ser. No. 822,775 filed Aug. 8, 1977, now abandoned and replaced with continuation patent application Ser. No. 960,322 filed Nov. 13, 1978, for "Reactive Ion Etching of Silicon." The RF induced plasma is reactive chlorine, bromine or iodine specie as specified in the Harvilchuck et al patent application. The thickness of the masking layer is between 2000-20,000 Angstroms, the exact thickness depending on the depth requirement of the silicon groove. A precise description of the RF discharge apparatus is given in the beforementioned patent application. The reactive ion etch or plasma ambient is preferably a combination of an inert gas such as argon and a chlorine specie. Application of suitable power is in the order of about 0.1-0.75 watts/$cm^2$ from an RF voltage source which produces sufficient power density to cause the reactive ion etching operation of silicon to be carried out at the suitable rate. The desired result of the etching is the shallow opening wherein the opening or channel partially penetrates the P-base region 10. This results in the FIG. 1 structure.

The next step in the process is to thermally oxidize the openings or channels by subjecting the body to an oxidation ambient which may be, for example, 970° C. in wet oxygen. The body is subjected to the ambient for about 10 to 30 minutes to produce the preferred silicon dioxide thickness within the opening or channel between about 500-2000 Angstroms. The purpose of the thermal oxide is to assure good silicon dioxide interface properties, the qualities of which are usually not as good with chemical vapor deposited dielectric material. Good quality dielectric material is necessary to permit the subsequent abutting of diffused junctions against the dielectric isolation. The complete filling of the opening with a suitable dielectric material is accomplished using vapor deposited silicon dioxide. The details of this process is described in the beforementioned Bondur et al patent application.

It may be preferred in some instances, prior to pyrolytic deposition step to ion implant boron ions through the bottom of the oxide at the bottom of the channel. This causes the formation of the P+ region underneath the isolation region which prevents the P− region under the isolation region from inverting to an N type material.

The pyrolytic silicon dioxide is deposited in a thickness of preferably 2 to 3 micrometers. The preferred filling process is a chemical vapor deposition of silicon dioxide using gas mixtures of $CO_2/SiH_4/N_4$ or $N_2O/SiH_4/N_2$ between 800 and 1000° C. The typical deposition rate is to the order of 50-100 Angstroms per minute.

The next step is the reactive ion etching of the chemical vapor deposited silicon dioxide layer to remove excess silicon dioxide from the surface. The system used for this process would be of the low pressure sputter etch type system with the wafer positioned on a silicon cathode cover plate. A fluorinated hydrocarbon such as $CF_4$ would type system with the wafer positioned on a silicon cathode cover plate. A fluorinated hydrocarbon such as $CF_4$ would be used as an etchant so that an $SiO_2/Si$ ratio of approximately 1:1 results. The gas pressure could run from 10 to 70 micrometers with gas flow rates of 2 to 50 cc/min. The RF power level runs from 0.1 watts/cm$^2$.

Figure 2:
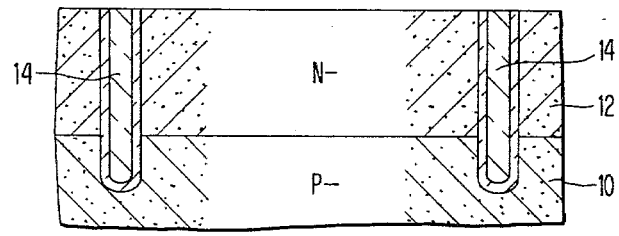

FIG. 2 now shows the complete isolation of the desired monocrystalline silicon regions by means of dielectric isolation regions 14. The surface of the body is reoxidized by growth of 0.1 to 0.2 microns of thermal silicon dioxide to bring the silicon dioxide layer 16 to the desired thickness.

Figure 3:
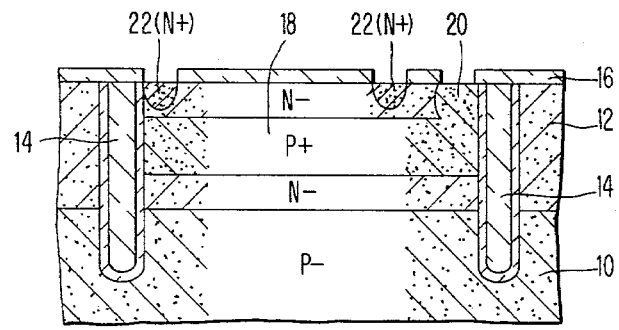
Figure 4:
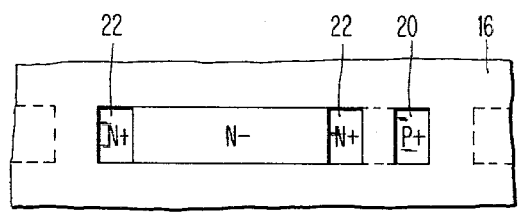

Referring now to FIG. 3, the buried implant for the PN junction isolation of the resistor is accomplished. Photolithography and etching techniques are utilized to expose and develop the photoresist pattern and then remove portions of the photoresist areas to expose the regions where P+ type ion implantation is to be accomplished. The structure is then placed in a suitable ion implantation apparatus wherein a boron ion implantation is accomplished using 200 to 500 KeV and $5 \times 10^{14}$ atoms/cm$^2$. It should be noted that a thin silicon oxide coating of 250 to 300 Angstrom units is allowed to remain on the surface of the structure. This silicon dioxide coating has the function of a screen for the ion implantation step. The result of the process is the P type buried region 18. The reach-through diffusion for the buried P region 18 is accomplished by applying a simple photoresist exposing, developing and etching the photoresist to expose the regions which are to be the P reach-through through the photoresist. The structure is again placed in the suitable ion implantation apparatus and a boron ion implantation applied to the surface of the structure using 150 KeV and a dosage of $5 \times 10^{12}$ atoms/cm$^2$. Subsequent high temperature processing step acts as annealing cycle. The structure now has the reach-through region 20 which connects the buried P region 18 with the surface of the silicon region.

The surface silicon dioxide layer is reoxidized and openings made through the surface oxide layer 17 for the resistor contact diffusions or ion implantations. The openings are made by conventional photolithography and etching techniques. The structure is placed, for example, in an ion implantation apparatus wherein phosphorus or arsenic ions of a dosage of $1 \times 10^{15}$ atoms/cm$^2$ and power of 200 KeV are implanted into the structures to form the resistor contact regions 22. The wafers are annealed at 1000° C. for about 10-20 minutes in an inert ambient to remove the ion implantation damage and activate the impurities. The opening to the P+ reach-through 20 is made through the surface oxide 17 resulting in the FIG. 3 vertical structure and the FIG. 4 horizontal structure.

A suitable ohmic contact metal is then evaporated or deposited by other means onto the upper surface of the structure. Typical contact material is aluminum or aluminum-copper. However, other well known materials in the art can be used such as platinum, palladium, molybdenum, and so forth. Photolithography and etching techniques are utilized for the desired conductive lines on the surface of the semiconductor structure from the blanket layer.

It is preferred in the interest of high density that the one contact region 22 be contiguous to the dielectric barrier and one end of the silicon region. Also the reach-through region of the opposite conductivity 20 should be contiguous to the dielectric barrier at that end of the resistor structure.

Figure 5:
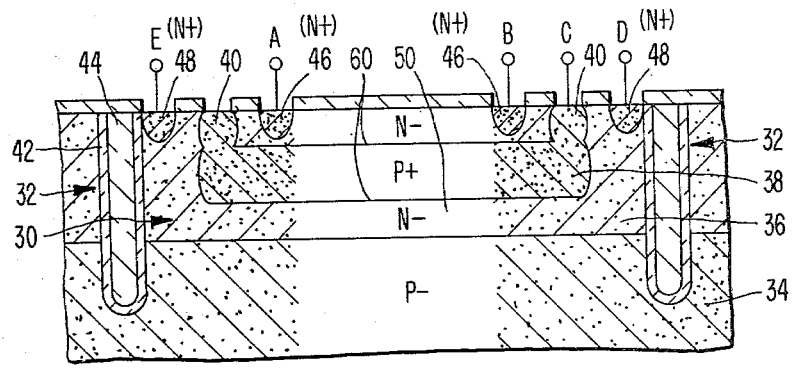
FIGS. 5 and 6 illustrate the final structure of a second form of the resistor of the present invention.
Figure 6:
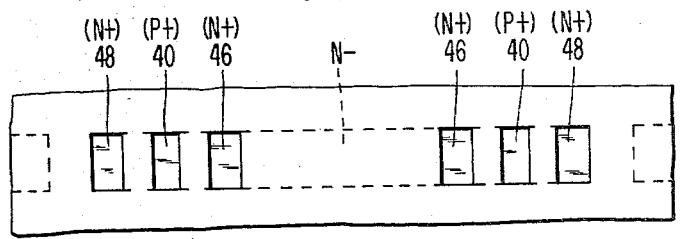

Referring now to FIGS. 5 and 6 a second embodiment is illustrated wherein two resistors are formed in a single dielectrically isolated monocrystalline silicon region. The FIG. 5 structure is composed of silicon regions 30 separated from like silicon regions by a dielectric barrier 32 surrounding each of the regions 30. Each of these silicon regions 30 include base region 34 of a first conductivity, a second region 36 of a second conductivity, a third region 38 of the first conductivity buried within the second region 36, and a reach-through region 40 of the first conductivity connecting the surface of the silicon regions with the third region 38. The dielectric barrier 32 is composed preferably of at least an outer layer 42 of thermally grown silicon dioxide in an inert layer of pyrolytically grown silicon dioxide. In the FIG. 5, the first conductivity is P type and the second conductivity is N type which produces an N type resistor. The N+ contact regions for the surface resistor are indicated as 46. The N+ type contact regions for the buried resistor are indicated as contact regions 48. The second and buried resistor is located below the first conductivity buried region 38 and is indicated as principally region 50 with the diffused contact regions 48. The plane view of the present embodiment is shown in FIG. 6.

The FIG. 5 and FIG. 6 structure may be fabricated according to the same processes described with regard to FIGS. 1-4. However, additional space is required between the dielectric isolation region 32 and the buried P+ region 38 and reach-through contacts 40, so as to allow for the second resistor contact regions 48.

Figure 7:
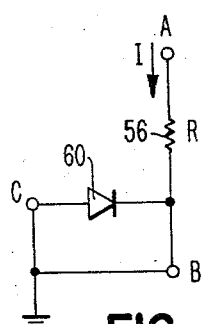
FIGS. 7 and 8 are circuit schematics of the two resistors illustrated structurally in FIGS. 5 and 6.
Figure 8:
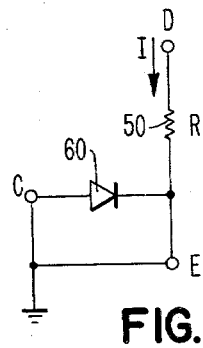

Referring now to FIGS. 7 and 8, there is shown the circuit diagram of the FIGS. 5 and 6 physical structure. FIG. 7 is the circuit of the surface resistor 56 with the contacts A, B and C given in FIG. 5. The diode 60 represents the PN junction between the region 38 and the region 50. FIG. 8 is the circuit representation for the buried resistor 50 which is located between contacts D and E. The isolating diode 60 is the PN junction between the region 38, 40 and the resistor region 50.

Figure 10:
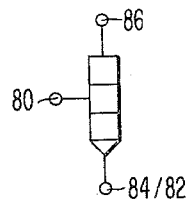
FIG. 10 is a circuit schematic of the NPN transistor of the FIG. 9 structure.
Figure 9:
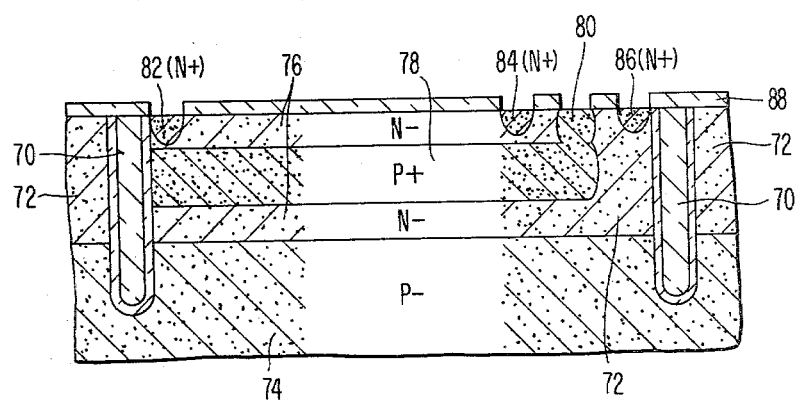
FIG. 9 is a third embodiment of the integrated circuit structure which is useful as a vertical transistor.

Referring now to FIG. 9, a third embodiment of the structure is shown wherein a masterslice type of personalization process is possible. A pattern of dielectric regions 70 in the silicon monocrystalline body isolate surface regions 72 of the body from one another. The monocrystalline silicon regions isolated from one another include a substrate of a first conductivity 74 for example, P type, and a region 74 of a second conductivity thereover. This region is typically grown by epitaxial techniques. A region of the first conductivity 78 is buried within the region of second conductivity 76. This region 78 is preferably formed by means of ion implantation as described above in regard to FIGS. 1-4. A reach-through 80 connects the buried region 78 with the surface. This reach-through is formed by either diffusion or ion implantation processes. Second conductivity dopant, for example N+, is utilized to form contacts for the surface resistor contacts 82 and 84 and a contact for the N— region 76 below the P+ buried region 78. A choice can now be made at the time of personalization to either make a resistor utilizing the contacts 82 and 84 or to form a transistor utilizing the contact 82/84 as an emitter, contact 80 as a base contact, and 86 as the collector contact. In the case where a resistor is desired, the silicon dioxide layer 88 would cover the contact region 86 and no metal ohmic contact would be made to this portion of the silicon monocrystalline region. In the case that a transistor is desired as shown in the FIG. 9 for illustrative purposes, the silicon dioxide layer 88 would cover one of the resistor contacts, for example contact 82. No ohmic contact would then be made to that portion of the region. FIG. 10 shows the circuit wherein 86 is the collector, 80 is the base and 84 is the emitter.

While the invention has been particularly shown and described with reference to the preferred embodiment thereof, it will be understood by those skilled in the art that various changes in form and detail may be made therein without departing from the spirit and scope of the invention.

What is claimed is:

1. The method of fabricating an integrated circuit structure containing resistors and transistors comprising:
    providing a silicon monocrystalline body which includes a substrate of a first conductivity and a region of a second conductivity thereover;
    forming a pattern of dielectric regions in said silicon monocrystalline body which isolate surface regions of said body from one another;
    forming a highly doped buried region of said first conductivity within said region of a second conductivity within at least certain of said isolated surface regions;
    forming a highly doped reach-through region of said first conductivity to connect the surface of said silicon regions to said buried region;
    forming electrical contacts to the said regions within said isolated regions of said body to fabricate said resistors in certain of said isolated regions and transistors in certain other of said isolated regions;
    wherein said resistors are formed, the said contacts are made to at least the said surface region of said second conductivity and said contact made to said reach-through region for biasing purposes; and
    wherein said transistors are formed, the said contacts are made to said surface region of second conductivity for the emitter, said contacts are made to said reach-through region of first conductivity for the base and said contacts are made to said region of second conductivity under said buried region for the collector.

2. The method of claim 1 wherein said dielectric regions are formed at least in part by a thermal oxidation process to produce silicon dioxide.

3. The method of claim 1 wherein said buried region is formed by ion implantation of a P type conductivity, said first conductivity is P and said second conductivity is N.

4. The method of claim 1 wherein said buried region is formed by ion implantation of a N-type conductivity, said first conductivity is N and said second conductivity is P.

5. The method of fabricating a resistance structure for high density integrated circuits comprising:
    providing a monocrystalline silicon body which includes a substrate of a first conductivity and a region of a second conductivity thereover;
    forming a pattern of dielectric regions in said silicon body which isolate surface regions of said body from one another;
    forming a highly doped buried region of said first conductivity within said region of a second conductivity within at least certain of said isolated surface regions;
    forming a highly doped reach-through region of said first conductivity to connect the surface of said silicon regions to said buried region;
    forming electrical contacts to the surface of said region of second conductivity to form a first resistor therein;
    forming an electrical contact to said reach-through region for biasing purposes; and
    making electrical contact to said region of second conductivity under said buried region for forming a second resistor.

6. The method of claim 5 wherein said buried region is formed by ion implantation of a P type conductivity said first conductivity is P and said second conductivity is N.

7. The method of claim 5 wherein said buried region is formed by ion implantation of a N-type conductivity, said first conductivity is N and said second conductivity is P.

* * * * *